United States Patent
Schmitt et al.

(10) Patent No.: US 8,462,496 B2
(45) Date of Patent: Jun. 11, 2013

(54) SYSTEM AND METHOD FOR A MODULAR FLUID HANDLING SYSTEM WITH MODES IN A MODULAR DATA CENTER

(75) Inventors: Ty Schmitt, Round Rock, TX (US); Mark M. Bailey, Burnet, TX (US); Tyler Duncan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 184 days.

(21) Appl. No.: 13/033,451

(22) Filed: Feb. 23, 2011

(65) Prior Publication Data

US 2012/0212901 A1   Aug. 23, 2012

(51) Int. Cl.
*G06F 1/20*    (2006.01)
*F28F 13/00*   (2006.01)
*H05K 7/20*    (2006.01)

(52) U.S. Cl.
USPC ............... 361/679.47; 361/679.53; 361/688; 361/695; 361/696; 165/80.2; 165/104.33; 165/185; 62/259.2; 454/184

(58) Field of Classification Search
USPC ............ 361/679.46–679.53, 679.01–679.03, 361/688–697, 700–712, 715–727; 165/104.33, 165/104.34, 80.2, 80.4, 185, 121–126, 104.14; 454/184; 62/259.2; 312/223.2, 223.3, 236, 312/265; 700/225, 278, 282, 299, 300
See application file for complete search history.

(56) References Cited

U.S. PATENT DOCUMENTS

| | | | |
|---|---|---|---|
| 7,325,410 B1 * | 2/2008 | Bean, Jr. et al. | 62/137 |
| 7,430,118 B1 * | 9/2008 | Noteboom et al. | 361/695 |
| 7,753,766 B2 * | 7/2010 | Master et al. | 454/184 |
| 7,944,692 B2 * | 5/2011 | Grantham et al. | 361/688 |
| 7,961,463 B2 * | 6/2011 | Belady et al. | 361/695 |
| 7,971,446 B2 * | 7/2011 | Clidaras et al. | 62/259.2 |
| 8,031,468 B2 * | 10/2011 | Bean et al. | 361/696 |
| 8,203,841 B2 * | 6/2012 | Chang et al. | 361/696 |
| 8,233,270 B2 * | 7/2012 | Pierson et al. | 361/679.02 |
| 8,246,442 B1 * | 8/2012 | Barrie | 463/20 |
| 8,266,921 B2 * | 9/2012 | Tashiro | 62/259.2 |
| 8,310,829 B2 * | 11/2012 | Monk et al. | 361/696 |
| 2008/0055846 A1 * | 3/2008 | Clidaras et al. | 361/687 |
| 2009/0241578 A1 | 10/2009 | Carlson et al. | 62/259.2 |
| 2010/0051563 A1 * | 3/2010 | Schreiber | 211/26 |
| 2010/0114356 A1 | 5/2010 | Schmitt et al. | 700/117 |
| 2010/0130117 A1 * | 5/2010 | Larsen | 454/184 |
| 2010/0139887 A1 | 6/2010 | Slessman | 165/67 |
| 2010/0139908 A1 * | 6/2010 | Slessman | 165/279 |
| 2010/0144265 A1 * | 6/2010 | Bednarcik et al. | 454/184 |
| 2011/0175498 A1 * | 7/2011 | Bash et al. | 312/107 |
| 2011/0307102 A1 * | 12/2011 | Czamara et al. | 700/277 |
| 2012/0006507 A1 * | 1/2012 | Su et al. | 165/80.2 |

OTHER PUBLICATIONS

International Search Report and Written Opinion; PCT/US2012/024100; pp. 11, May 10, 2012.

* cited by examiner

*Primary Examiner* — Michail V Datskovskiy
(74) *Attorney, Agent, or Firm* — Baker Botts L.L.P.

(57) ABSTRACT

In accordance with the present disclosure, a system and method for a modular fluid handling system with modes in a modular data center is presented. According to the present application, a modular data center may include a modular primary structure. The modular primary structure may include a plurality of information handling systems arranged in racks within it. The modular data center may also include a modular fluid handling system that circulates fluid through the modular primary structure according, at least in part, to a plurality of modes. The modular fluid handling system may be designed to accommodate environmental conditions in which the modular data center will operate as well as the usage requirements of the modular primary structure.

15 Claims, 6 Drawing Sheets

SYSTEM AND METHOD FOR A MODULAR FLUID HANDLING SYSTEM WITH MODES IN A MODULAR DATA CENTER

CROSS REFERENCES TO RELATED APPLICATIONS

This application is related to co-pending U.S. patent application Ser. No. 13/022,018 entitled "System and Method for Designing a Configurable Modular Data Center" which was filed on Feb. 7, 2011, U.S. patent application Ser. No. 13/021,971 entitled "System and Method for Concurrent Manufacturing, Testing, and Integration of a Modular Data Center" which was filed on Feb. 7, 2011, U.S. patent application Ser. No. 13/022,136 entitled "System and Method for Structural, Modular Power Distribution in a Modular Data Center", which was also filed on Feb. 7, 2011, U.S. patent application Ser. No. 13/022,211 entitled "System and Method for an Optimizable Rack Solution", which was also filed on Feb. 7, 2011, all of which are incorporated herein by reference for all purposes.

TECHNICAL FIELD

The present disclosure relates generally to the operation of computer systems and information handling systems, and, more particularly, to a System and Method for a Modular Fluid Handling System with Modes in a Modular Data Center.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

A group of information handling systems may be included within a data center. A data center will typically include multiple information handling systems (e.g. servers), which may be arranged in racks. Each server will typically generate heat, and the concentration of a number of servers in the defined space of a data center will generate a substantial amount of heat, which can damage sensitive components if not reduced. Special care must be taken in the particularly confined space of a containerized data center, commonly built in a shipping container, where heat can build quickly. Most containerized data centers include multiple cooling components within the shipping container to circulate air within the data center and decrease the temperature. Commonly, one cooling component is an air conditioning system that runs for extended periods of time to artificially cool the interior space of the containerized data center while the information handling systems within the data center operate. Air conditioning and other artificial cooling systems are notoriously power hungry, costly, and inefficient. Cooling components also typically include fans within the enclosure or within each server to circulate cool air through the servers. Some containerized data centers may include hundreds of fans, each of which require power to operate, increasing operating costs. Each of the fans also may, at some point, require maintenance, which typically requires taking either a server or an entire rack of servers offline for repairs.

Additionally, information handling systems, including servers, like all technology, undergoes upgrades and modifications. Data centers are often reconfigured to meet new and/or different equipment needs. This may require that individual racks and servers be relocated and/or replaced. Containerized data centers, due to the unique cooling considerations discussed above, are typically designed with cooling components and cooling systems tailored to one configuration of racks using a particular type of servers. Changing the placement of racks or the type of server in a containerized data center can render a containerized data center's cooling system ineffective. Accordingly, the cooling components and cooling systems of typical containerized data center make upgrading or modifying the data center costly and inefficient.

SUMMARY

In accordance with the present disclosure, a system and method for a modular fluid handling system with modes in a modular data center is presented. According to the present application, a modular data center may include a modular primary structure. The modular primary structure may include a plurality of information handling systems arranged in racks within it. The modular data center may also include a modular fluid handling system that circulates fluid through the modular primary structure according, at least in part, to a plurality of modes. The modular fluid handling system may be designed to accommodate environmental conditions in which the modular data center will operate as well as the usage requirements of the modular primary structure.

The system and method disclosed herein is technically advantageous because it increases the efficiency of a modular data center by providing a plurality of modes that may reduce the power required to maintain fluid movement and temperature within the modular data center. In some embodiments, the modular fluid handling system may be located outside of the primary enclosure of the modular data center, allowing for a much wider range of fluid handling designs and freeing up valuable space for information handling systems within the primary structure of the modular data center. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Figure 1:
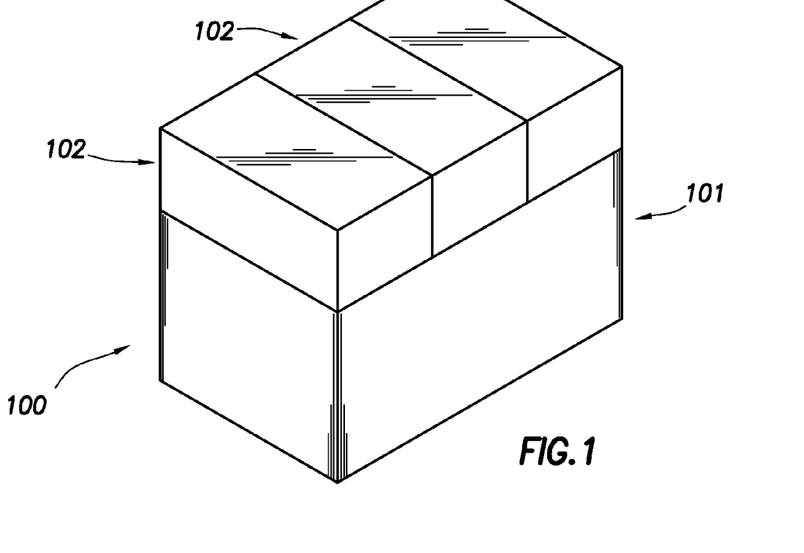
FIG. 1 is a functional illustration of one embodiment of a modular data center incorporating a modular fluid handling system.

Shown in FIG. 1 is a functional illustration of a modular data center 100, according to one embodiment of the present invention. The modular data center 100 includes primary structure 101. The primary structure 101 typically includes a plurality of information handling systems mounted in racks. FIG. 1 further includes a modular fluid handling system 102, which includes a plurality of air-handling units 102 mounted on top of primary structure 101. As will be discussed below, a modular fluid handling system can be installed without affecting the placement of racks within a modular data center, may include a plurality of different sized structural enclosures, modules, and fluid handling equipment with different functions, may be designed to allow the removal of all fluid handling elements from within the primary structure 101, and may include a plurality of modes.

Figure 2:
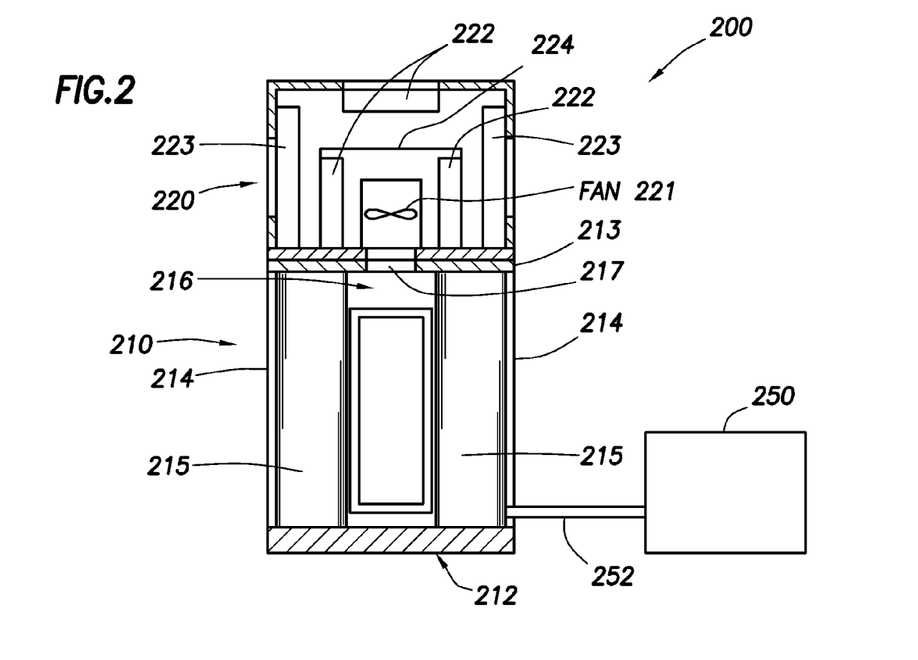
FIG. 2 is a cross section of a modular data center incorporating one embodiment of a modular fluid handling system.

FIG. 2 is a cross section of a modular data center 200 according to one embodiment of the present invention, and includes a cross section of one embodiment of a component of a modular fluid handling system, air-handling unit 220. The modular data center 200 may comprise a modular data center as described in cross-referenced application entitled "System and Method for Designing a Configurable Modular Data Center." Modular data center 200 includes a primary structure 210, which may correspond to an IT module from the cross-referenced application. The primary structure 210 includes a base 212, top 213, and sides 214. The sides 214 of the primary structure 210 may be open, allowing fluid communication between the outside environment and the interior of the primary structure 210. Within the primary structure are racks 215, populated within information handling systems. Between the racks 215 is an aisle 216. Above the aisle 216, between the air-handling unit 220 and the primary structure 210 is an aperture 217. The aperture 217 is formed when an opening in the top 213 of the primary structure 210 aligns with an opening in the bottom of air-handling unit 220. Fluid communication is possible between the air-handling unit 220 and the aisle 216 of the primary structure 210 through the aperture 217.

Air-handling unit 220 may be mounted above the primary structure 210, as shown in FIG. 2. The air-handling unit 220 may be one of a plurality of similarly sized and designed air-handling units that are mounted on top of primary structure 201, as can be seen, for example, in FIG. 1. Air-handling unit 220 may also share at least one dimension in common with the primary structure 210, width as shown in FIG. 2. Other embodiments may include air-handling units manufactured integrally with the primary structure, air-handling units in a variety of shapes and sizes, as well as air-handling units in other locations, such as along the sides of the primary structure, or underneath the primary structure. The air-handling unit 220 of FIG. 2 includes a fan 221 mounted over aperture 217 along the bottom of the air-handling unit 220, which may be bi-directional, such that it can either push air into primary structure 210 or pull air out of primary structure 210. The air-handling unit 220 also includes a dampers 222. One damper may be located along the top of the air-handling unit 220, which can be modulated to effectuate fluid communication between the interior of the air-handling unit 220 and the outside environment through the top of the air-handling unit 220. The air-handling unit 220 may also include dampers 222 located between the fan 221 and cooling mechanisms 223 on both sides of the air-handling unit 220. The air-handling unit 220 may be in fluid communication with the outside environment through the cooling mechanisms 223. In one embodiment, the cooling mechanisms 223 are coils through which chilled water is circulated. The coils effectuate heat transfer between the air passing through the coils and the water within the coils, effectively cooling the air as it passes through. Other well known cooling mechanisms could also be used instead of cooling mechanisms 223.

Another embodiment of a modular fluid handling system may be refrigerant unit 250. The refrigerant unit 250 may be connected via pipes or tubes 252 to coils within the racks 215. The refrigerant unit 250 may pump refrigerant through coils within the racks 215, thereby removing heat from the racks. This embodiment is advantageous because it removes heat from the racks without requiring constant airflow through the racks 215. The refrigerant unit 250 is also illustrative of the fact that modular fluid handling units are not limited to the movement of air; rather, many fluids well known in the art, such as water or refrigerant, may be circulated via a modular fluid handling unit.

Figure 3:
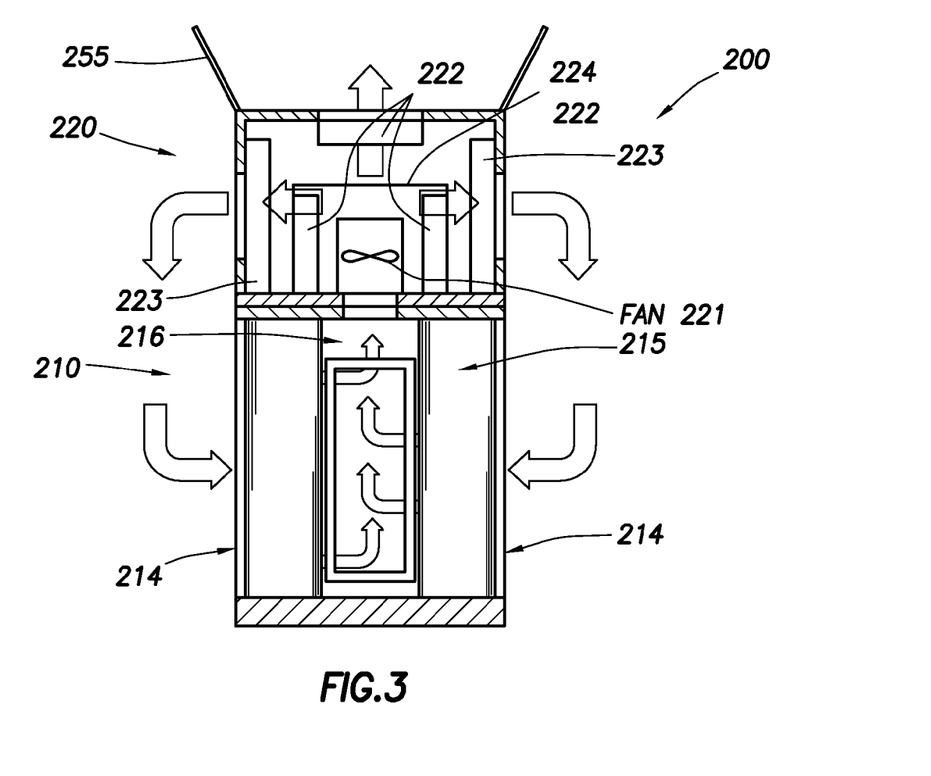
FIG. 3 is a cross section of the embodiment shown in FIG. 2 that includes air flow patterns.

FIG. 3 is the cross section of the modular data center 200 of FIG. 2 with arrows to illustrate the possible airflow patterns through the modular data center associated with the embodiment of the modular fluid handling system shown. As shown, the fan 221 of the air-handling unit 220 is set to pull air from the aisle 216 of the primary structure 210. When air is pulled from the aisle 216 of the primary structure 210, the effective air pressure within the aisle 216 is decreased. To equalize the air pressure within the aisle 216, air flows from the outside environment through sides 214 and then into the aisle 216 through racks 215. The direction of fan 221 may be reversed, so that air pressure within the aisle 216 is increased. The air will then flow from the aisle 216 through the racks 215 to the outside environment. Whether the fan 221 is set to push air into the aisle 216 or pull air from the aisle 216, however, generating airflow through the entire primary structure in the manner described above it beneficial. In particular, generating airflow through the entire primary structure using the embodiment of the modular fluid handling system shown in FIG. 3 allows for the removal of the individual air handling units, such as fans, from each of the information handling systems located within the primary structure—providing a substantial cost and power savings—while at the same time simplifying the placement of information handling systems within the primary enclosure.

Figure 4:
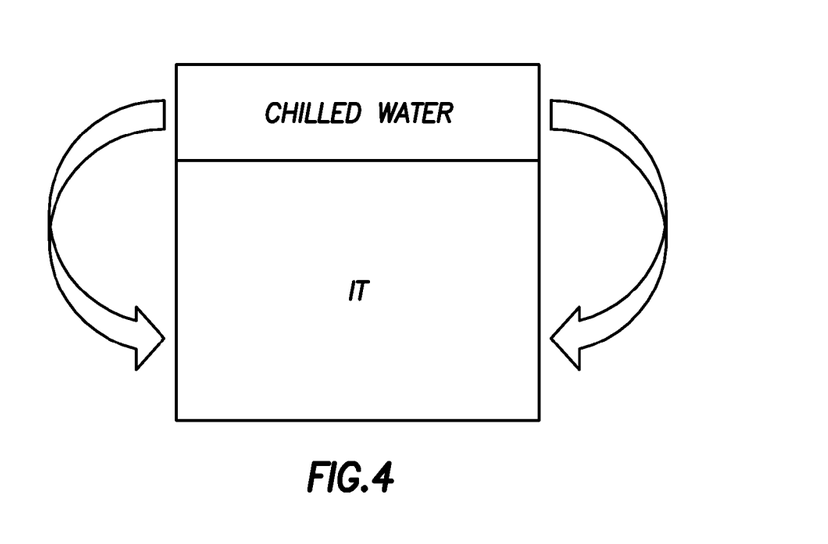
FIG. 4 is a functional illustration of the modular data center in FIG. 2 operating in a first mode.

The air-handling unit 220 shown in the embodiment of the modular data center 200 shown in FIG. 3 is additionally advantageous because it can be selectably run in at least two modes, which may incorporate non-conditioned, outside air. As mentioned previously, existing containerized data centers typically include cooling systems, such as air conditioning systems, that run continuously, or for extended periods of time, to cool the interior of the data center. These air conditioning systems are power hungry, costly, and inefficient. The embodiment of the modular fluid handling system shown in FIG. 3 may include multiple modes, where air or another fluid may be circulated through the primary structure 210, and the information handling systems within the primary structure 210, using all fresh air or a mixture of fresh and conditioned air. Once the air is pulled from the aisle 216 as shown in FIG. 3, the air accumulates within the air-handling unit 220, building air pressure. If the dampers 222 on either side of the fan 221 are open and the damper 222 on the top of the air-handling unit 220 is closed, the air is forced through the artificial cooling mechanisms 223. The temperature of the air decreases as it travels through the cooling mechanisms 223, mixes with the fresh air outside of the modular data center—effectively lowering the temperature of the air surrounding the data center—and is circulated back through the modular data center 200. In this manner, the modular data center 200 can utilize a mixture of fresh and cooled air, particularly when the fresh air is slightly above the normal temperature range of the information handling system. This mode of operation may be called the "chilled water" mode, a functional diagram of which can be seen at FIG. 4.

Figure 5:
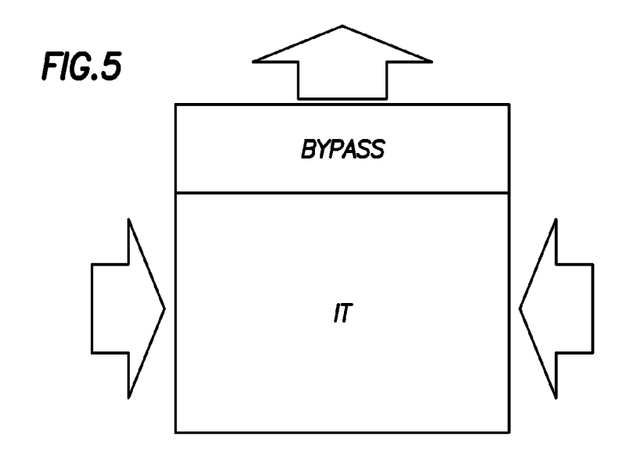
FIG. 5 is a functional illustration of the modular data center in FIG. 2 operating in a second mode.

When the damper 222 at the top of the air-handling unit is open and the dampers 222 on either side of the fan 221 are closed, the air within the air-handling unit 220 of FIG. 3 may escape through the top of the air-handling unit 220, bypassing the cooling mechanisms 223. This mode may be called bypass mode, a functional diagram of which can be seen at FIG. 5. When in bypass mode, the cooling mechanisms 223 can normally be turned off, providing a substantial power savings. Once the heated air escapes the air-handling units 210, the air will generally mix with the environmental air and dissipate. In some embodiments, the air may be directed through the damper 222 at the top of the air-handling unit 220 into a baffling or duct work 255 attached to the top of the air-handling unit 222. This configuration is particularly advantageous when the modular data center 200 is installed within a building or structure, such as an air-conditioned warehouse, with an external temperature regulation system that takes the exhaust air, cools it, and pumps temperature controlled air back into the environment surrounding the modular data center.

Figure 3A:
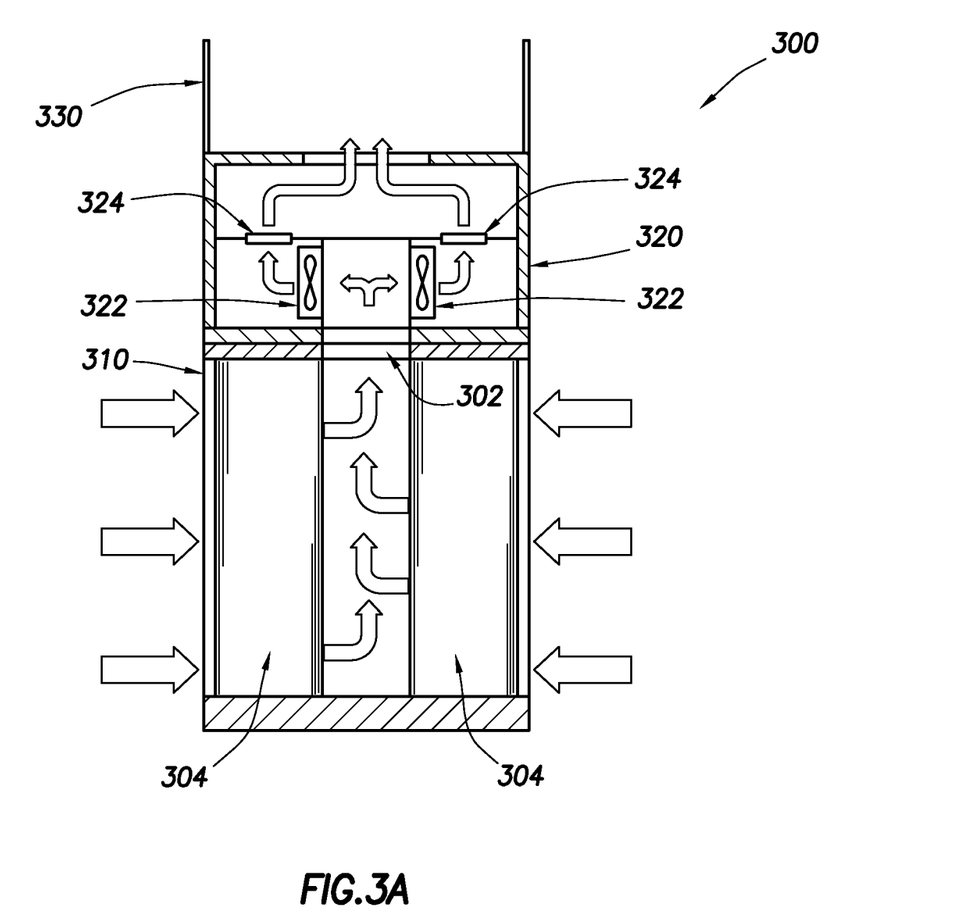
FIG. 3a is cross section of a modular data center incorporating one embodiment of a modular fluid handling system.

The modular fluid handling system incorporated in the embodiment of the modular data center shown in FIG. 3 is useful, for example, in indoor environments or in outdoor environments, where conditions are ideal, or close to ideal, e.g. where the air temperature is generally moderate and the humidity is low. Other modular data centers may be deployed in indoor environments only, where the air intake is conditioned, and the heated exhaust air is vented away from the modular data center. One such example modular data center is modular data center 300, found in FIG. 3a. Like FIG. 3, FIG. 3a shows a cross section of a modular data center with a primary structure 310 and a modular fluid handling system 320. Like the modular data center 200 of FIG. 3, the modular fluid handling system 320 is in fluid communication with primary structure 310 through an aperture 302. The modular fluid handling system 320 may also be in electrical and signal communication with the primary structure 310 through a plurality of wires and connectors. The electrical and signal communications may be useful to provide power to and control elements within the modular fluid handling system 320. Unlike the modular data center in FIG. 3, the modular fluid handling system 320 includes two fans 322, positioned perpendicular to the aperture 302. The modular fluid handling system 320 may also include dampers 324 which may control the amount of airflow out of the modular fluid handling system. As can be seen via the arrows in FIG. 3a, conditioned air is pulled into the sides of the modular data center 300 through the open sides of the data center. The air then passes through the information handling systems within the racks 304 of the modular data center. The air is then drawn up into the modular fluid handling system where it may pass by dampers 324 and be expelled through the top of the modular fluid handling system 300. As can be seen, the modular fluid handling system 320 includes solid sides so that the air is forced through the upper opening in the modular fluid handling system 320 and into the venting system 330, which removes the exhaust air.

If environmental conditions are not ideal, if the air is too humid, for example, or the temperature too extreme (hot or cold), using fresh air may not be ideal, as it may harm sensitive components within the information handling systems. Other embodiments of a modular data center may incorporate embodiments of a modular fluid handling system that are designed for such environments. One such embodiment is the modular data center 600 shown, via cross section, in FIG. 6. The modular data center 600 includes a primary structure 610 with a base 611, sides 612, and top 613 and a modular fluid handling system 620. The modular fluid handling system 620 includes a air-handling unit 630 and a containment module 640. The primary structure 610 includes only one row of racks 614. Within the primary structure 610 is an aisle 616, accessible through a door, which occupies the leftmost space of the primary structure 610. Above the aisle 616 is an aperture 617, formed when an opening in the top 613 of the primary structure 610 aligns with an opening in the bottom of air-handling unit 630. Fluid communication is possible between primary structure 610 and the air-handling unit 630 through the aperture 617. Fluid communication is also possible between the primary structure 610 and the containment module 640 through the side 612 disposed between the interior of the primary structure 610 and the containment module 640.

Figure 6:
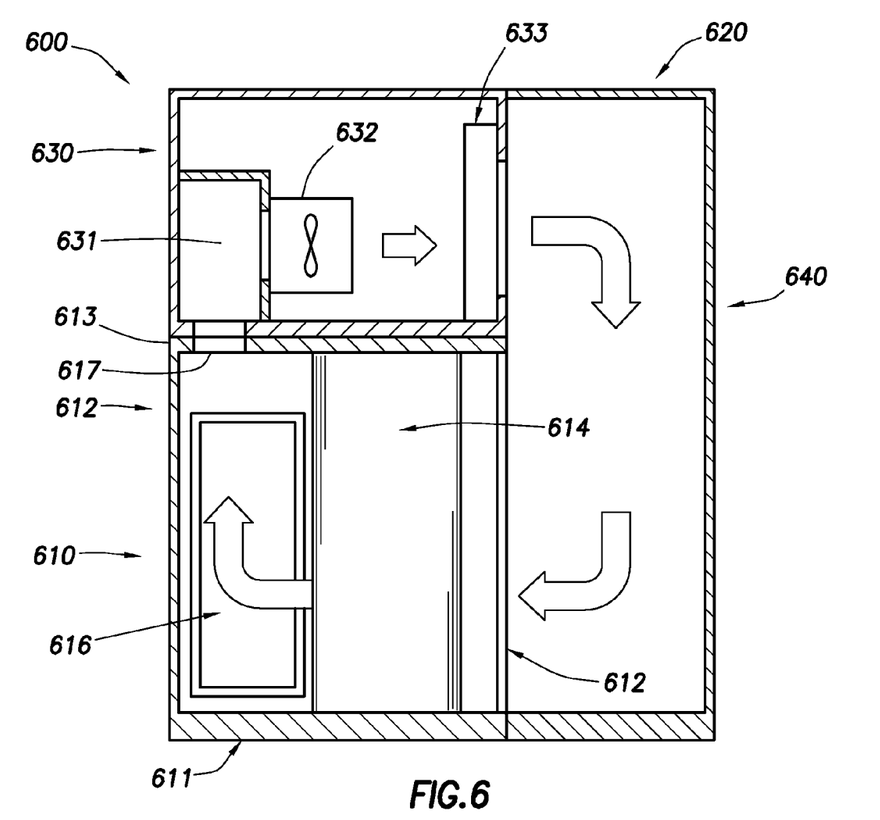
FIG. 6 is a cross section of a modular data center incorporating an embodiment of a modular fluid handling system.

Attached above the primary structure 610 in FIG. 6, is air-handling unit 630 with a width substantially the same as the width of the primary structure 610. The air-handling unit 630 includes an enclosure 631, which is positioned over the aperture 617 in the air-handling unit 630. Attached to the side of the enclosure 631 is a fan 632, which can be operated bi-directionally. Cooling mechanism 633 is included along the side of the air-handling unit 630, as described previously. The air-handling unit 630 is in fluid communication with containment module 620 through the cooling mechanism 633. The air containment module 640 captures and contains the air that is circulated through the modular data center 600. As can be seen by the air flow arrows, the fan 632 is set to pull air from the aisle 616, causing air to be pulled in from the containment module 640 through the racks 614. The air from the aisle 616 is pulled into the air-handling unit 630, where it travels through and is cooled by the cooling mechanism 633. The cooled air then flows into the air containment module 640, to be recirculated back into the primary structure 610. Notably lacking from the modular data center 600 of FIG. 6 is the capability to switch between modes. Rather, due to the dirty air environment for which the modular fluid handling system of the modular data center 630 is designed, all air must be cooled and recirculated. The modular data center 630 of FIG. 6, however, is still advantageous because it allows for the removal of the fans included within each information handling system designed to circulate air, and does not restrict the placement of racks and information handling systems within the primary structure 610. Additionally, modular data center 630 can be placed in a variety of environments, as it does not rely on outside air circulation. This arrangement may be particularly advantageous when used, for example, in the design of a modular data center according to the aforementioned cross-referenced application entitled "System and Method for Designing a Configurable Modular Data Center."

Figure 7:
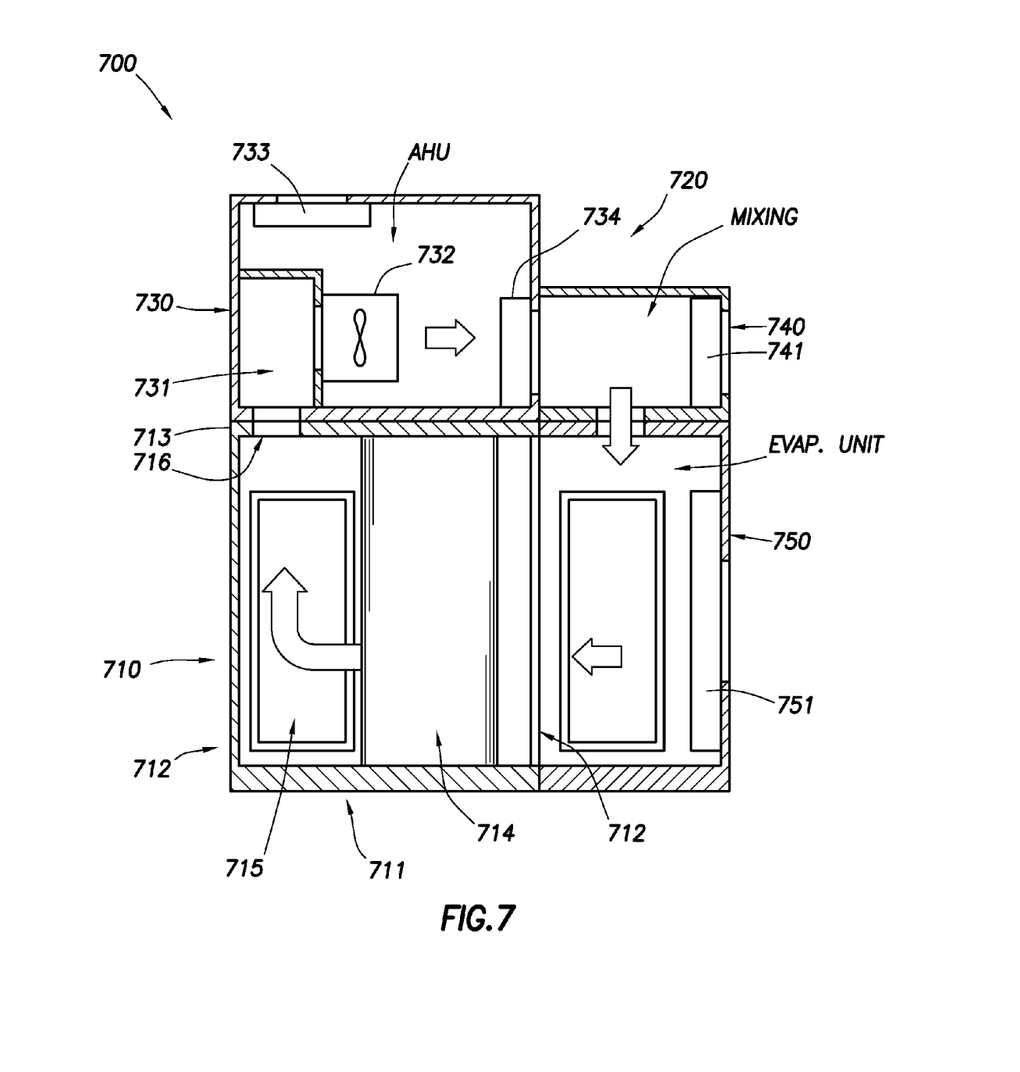
FIG. 7 is a cross section of a modular data center incorporating an embodiment of a modular fluid handling system.

FIG. 7 illustrates another embodiment of a modular data center 700 designed for use in non-ideal environment conditions, but which incorporates a modular fluid handling system 720 that provides multiple modes, including modes for cooling and heating external air. The modular data center 700 includes a primary structure 710 with a base 711, sides 712, and top 713. The modular fluid handling system 720 includes an air-handling unit 730, a mixing unit 740, and an evaporative unit 750. The primary structure 710 includes one row of racks 714. Within the primary structure 710 is an aisle 715, which occupies the leftmost space of the primary structure 710. Above the aisle 715 is an aperture 716, formed when an opening in the top 713 of the primary structure 710 aligns with an opening in the bottom of air-handling unit 730. Fluid communication is possible between the air-handling unit and the primary structure 710 and the air-handling unit 730 through the aperture. Fluid communication is also possible between the primary structure 710 and the evaporative module 750 through the side 712 disposed between the interior of the primary structure 710 and the evaporative module 750.

Attached above the primary structure 710 in FIG. 7, is air-handling unit 730 with a width substantially the same as the width of the primary structure 710. The air-handling unit 730 includes an enclosure 731, which is positioned over the aperture 716 in the air-handling unit 730. Attached to the side of the enclosure 731 is a fan 632. The air-handling unit 730 also includes two dampers 733 and 734. Damper 733, when modulated to an open position, allows air from within the air-handling unit to mix with air outside of the modular data center 700. Damper 734, when opened, allows fluid communication between the air-handling unit 730 and the mixing unit 740. Mixing unit 740 is in fluid communication, via vents or other well known materials, with the evaporative module 750. Mixing module 740 also includes a damper 741, which, when opened, allows fluid communication between the mixing module 740 and the outside environment. Evaporative unit 750 includes an cooling mechanism 751, such as an evaporator, which can cool the air as well as decrease the humidity within the intake. In some embodiments, the air intake side of mixing module 740 and evaporative module 750 may be covered by at least one protection element, which allows the modular data center to operate outdoors, exposed to environmental elements and animals. These protection elements may include, but are not limited to, storm louvers, bird screens, filtration elements, and dampers. In operation, air may first pass through storm louvers, which may be automatically opened or closed depending on whether conditions using programmable logic, then the bird screens, which prevent animals from harming the electronic equipment within the modular data center, then filters, which removes particulate matter from the air, and finally evaporative media, which conditions the air for use within the modular data center.

Figure 8:
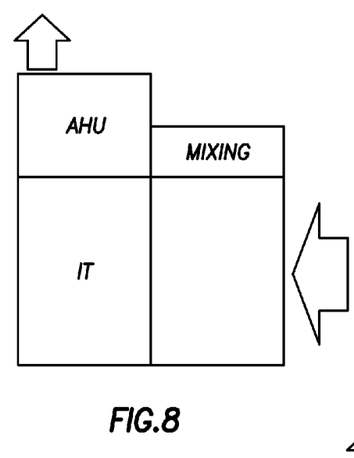
FIG. 8 is a functional illustration of the modular data center in FIG. 7 operating in a first mode.

The embodiment of the modular data center 700 that incorporates the modular fluid handling system 720 provides a plurality of modes through the modulation of dampers—air temperature, humidity, etc. In some embodiments, the modular fluid handling system 720 may be automated. For example, the modular fluid handling system may include a plurality of sensor in the primary structure 710, the air-handling unit 730, or outside of the modular data center 700. These sensors may electronically read air temperature and humidity and send the reading to an information handling system. Depending on the environmental readings, the information handling system may electronically and in an automatic fashion cause particular dampers within the modular fluid handling system 720 to be modulated based on predetermined airflow patterns and conditions. The dampers may be modulated using any of a number of system well known in the art, such as electronic motors. In some embodiments, programmable logic on an information handling system may be used to control the dampers as well as the fans and the cooling elements within the modular fluid handling system The modular fluid handling system 720 incorporated into modular data center 700 may include at least three modes. In the first mode, illustrated as a functional illustration in FIG. 8, dampers 734 and 741 are closed, damper 733 is open, and damper 751 is open and the cooling mechanism 751 is turned off. As can be see in FIG. 8, the modular data center uses as intake the fresh, non-artificially cooled air outside the modular data center 700 and expels the air through the top of the modular data center, making the first cooling mode useful in moderate conditions. Returning to FIG. 7, with dampers 734 and 741 closed, and artificial cooling mechanism 751 turned off, the outside air enters the modular data center 700, without being cooled, and is pulled through the side 712 of the primary structure 710 and into the aisle 715, past racks 714. The air is then pulled from the aisle 715 and into the air-handling unit 730 by fan 732. Once in the air handling unit 730, the air is expelled through the top of the air handling unit 730, due to the damper 733 being open and the damper 734 being closed. This cooling mode is the most efficient, because no artificial cooling system is required and none of the information handling systems within the primary structure 710 require fans to move the air through the racks 715.

Figure 9:
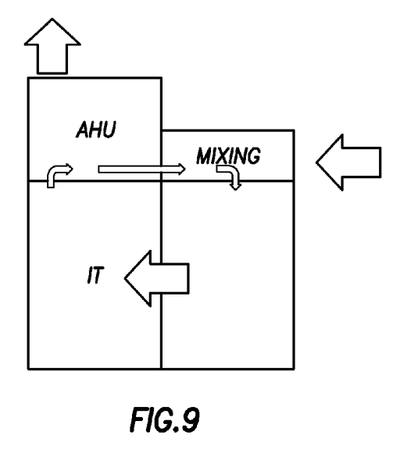
FIG. 9 is a functional illustration of the modular data center in FIG. 7 operating in second mode.

The second mode, functionally illustrated in FIG. 9, may be used in conditions where the outside air is too cold to be used as is, and requires dampers in 751 to be closed, dampers in 741 to be open and dampers 733 and 734 are modulated to control the balance of module exhaust air and the amount of exhaust air that is mixed with outside air. When the modular fluid handling system 720 is operating in this mode, the air enters the modular data center 700 through the mixing unit 740, past the damper 741. The air entering the mixing unit 740 from the outside mixes with air entering the mixing unit 740 from the air-handling unit 730 via damper 734. Because the outside air is cold or too humid, and the air from the air-handling unit is warmer—after passing through the information handling systems—the air mixes in the mixing chamber to a temperature that is within a predetermined temperature or humidity range. If the air is too cold or too warm, for example, the dampers 733, 734 or 741 can be modulated, restricting the amount of air entering the mixing unit 740 for either the air-handling unit 730 of the outside, thereby changing the resultant air temperature or humidity. The warm air from the mixing unit 740 is then pulled into the evaporative module 750, through the racks 715, and into the aisle 716 by the fan 732. The air is them pulled into the air-handling unit 730, where some of the air is expelled into the outside via damper 733 and some enters the mixing unit 740 via damper 734.

Figure 10:
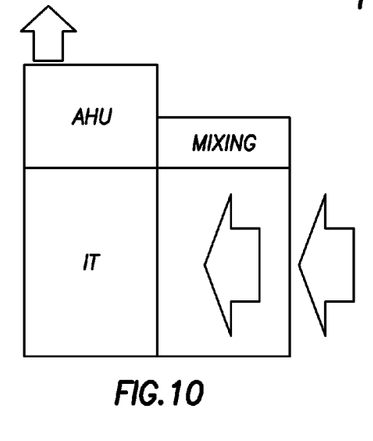
FIG. 10 is a functional illustration of the modular data center in FIG. 7 operating in a third mode.

The third mode, functionally illustrated in FIG. 10, may be used in conditions where the outside air is too hot to be used as is, and requires dampers 734 and 741 to be closed, the damper in 751 to be opened, and the cooling mechanism 751 to be turned on. As can be seen in FIG. 10, the third cooling mode includes an airflow pattern very similar to the airflow pattern of the first mode, illustrated in FIG. 8. The difference is that the cooling mechanism 751 is turned on in FIG. 10 to cool the outside air before it enters the modular data center 700, as the air outside is too hot. Even though this mode requires the cooling mechanism 751 to be turned on, using power, this mode still provides efficiency advantages because the air can be circulated through the primary structure 710 without using fans in each of the individual information handling systems. Example cooling mechanisms may be evaporative, direct expansion, chilled water, or indirect expansion.

Although the disclosure has describe the movement of air through a modular data center, a modular fluid handling system should not be seen as limited to the movement of air through a data center. Instead, as will be appreciated by one of ordinary skill in the art in view of this disclosure, any number of fluids may moved and handled within the scope of this disclosure. For example, a modular fluid handling system may also include the movement of refrigerant, water, or any fluid well known in the art. Additionally, a modular fluid handling system should not be seen as limited to cooling a modular data center. Instead, a modular fluid handling system may be used to cool, heat, move air, condition air, move water, etc.

The modular fluid handling system for a modular data center described herein will tend to reduce the cost of manufacturing and operating a modular data center. The power necessary to cool a modular data center can be decreased by circulating fresh, non-artificially cooled air through the modular data center. Additionally, the information handling systems no longer need individual fans to circulate air if air is circulated throughout the interior of a modular data center. Also, locating a cooling system outside of the primary enclosure of a modular data center saves space within the data center, and makes placing information handling systems within the system easier. Although the present disclosure has been described in detail, it should be understood that various changes, substitutions, and alterations can be made hereto without departing from the spirit and the scope of the invention as defined by the appended claims.

What is claimed is:

1. A modular data center comprising:
    a first structure;
    a plurality of information handling systems arranged in a rack within the first structure; and
    a modular fluid handling system coupled to the first structure, wherein the modular fluid handling system comprises:
        at least one structural enclosure in fluid communication with the first structure, wherein the at least one structural enclosure is an air handling unit,
        a second structural enclosure including at least one cooling element and at least one damper, wherein the at least one damper, when opened, allows fluid communication between the second structural enclosure and the outside environment, and
        a third structural enclosure in fluid communication with the at least one structural enclosure and the second structural enclosure, the third structural enclosure including at least one damper.

2. The modular data center of claim 1, wherein the air-handling unit is sized to handle air for a set of the plurality of information handling systems that do not include individual air-handling units.

3. The modular data center of claim 1, where the air-handling unit includes at least one damper.

4. The modular data center of claim 3, wherein the dampers are modulated in response to environmental conditions external to the modular data center.

5. The modular data center of claim 1, wherein the second structural enclosure is in fluid communication with the first structure.

6. The modular data center of claim 1, wherein the air-handling unit conditions air passing through the plurality of information handling systems.

7. The modular data center of claim 5, wherein the second structural enclosure conditions air passing through the plurality of information handling systems.

8. A modular fluid handling system for a modular data center, comprising:
    a fan;
    a cooling mechanism; and
    at least one damper;
    wherein the fan is operable to circulate air through the modular data center in one of a plurality of air flow patterns caused, at least in part, by the at least one damper;
    wherein the multiple air flow patterns comprise:
        a first airflow pattern wherein only air internal to the modular data center is circulated through the data center;
        a second airflow pattern wherein only air external to the modular data center is circulated through the data center without being cooled by the cooling mechanism;
        a third airflow pattern wherein only air external to the modular data center is circulated through the data center after being cooled by the cooling mechanism; and
        a fourth airflow pattern wherein air external to the modular data center is circulated through the data center after being mixed with exhaust air from the modular data center;
    wherein the modular data center includes a primary structure and the array of air-handling units are mounted to the top of the primary structure.

9. The modular fluid handling system of claim 8, wherein the modular fluid handling system includes an array of air-handling modules in fluid communication with the modular data center.

10. The modular fluid handling system of claim 9, wherein each of the array of air-handling modules includes a fan, a cooling mechanism, and at least one damper.

11. The modular fluid handling system of claim 8, wherein the array of air-handling units are sized to handle air for a set of servers within the primary structure that do not have individual air-handling units.

12. The modular fluid handling system of claim 8, wherein the at least one damper is operable to be automatically modulated.

13. A method for selectably cooling a modular data center, comprising:

proviing a modular data center that includes a modular fluid handling system, wherein the modular fluid handling system includes a plurality of air flow patterns for air moving through the modular data center;

providing a plurality of electronic sensors to measure air temperature inside and outside of the modular data center; and providing at least one information handling system, wherein the information handling system is operable to receive signals from the electronic sensors and select and operate one of the plurality of air flow patterns based, at least in part, on the signals from the electronic sensors;

wherein the plurality of air flow patterns comprise:

a first airflow pattern wherein only air internal to the modular data center is circulated through the data center;

a second airflow pattern wherein only air external to the modular data center is circulated through the data center without being cooled by the cooling mechanism;

a third airflow pattern wherein only air external to the modular data center is circulated through the data center after being cooled by the cooling mechanism; and a fourth airflow pattern wherein air external to the modular data center is circulated through the data center after being mixed with exhaust air from the modular data center;

wherein the modular data center includes a primary structure and the array of air-handling units are mounted to the top of the primary structure.

14. The method of claim 13, wherein the modular fluid handling system includes at least one damper.

15. The method of claim 13, wherein the modular fluid handling system includes a fan, an artificial cooling mechanism, and at least one damper.

* * * * *